US012757652B2

(12) United States Patent
Kuribayashi et al.

(10) Patent No.: US 12,757,652 B2
(45) Date of Patent: Oct. 6, 2026

(54) METHOD OF PROCESSING SUBSTRATE, RECORDING MEDIUM, SUBSTRATE PROCESSING APPARATUS AND METHOD OF MANUFACTURING SEMICONDUCTOR DEVICE

(71) Applicant: Kokusai Electric Corporation, Tokyo (JP)

(72) Inventors: Koei Kuribayashi, Toyama (JP); Arito Ogawa, Toyama (JP); Norikazu Mizuno, Toyama (JP)

(73) Assignee: KOKUSAI ELECTRIC CORPORATION, Tokyo (JP)

( * ) Notice: Subject to any disclaimer, the term of this patent is extended or adjusted under 35 U.S.C. 154(b) by 755 days.

(21) Appl. No.: 17/946,217

(22) Filed: Sep. 16, 2022

(65) Prior Publication Data

US 2023/0091654 A1 Mar. 23, 2023

(30) Foreign Application Priority Data

Sep. 17, 2021 (JP) ................................ 2021-151868

(51) Int. Cl.
*H01L 21/02* (2006.01)
*C23C 16/40* (2006.01)
(Continued)

(52) U.S. Cl.
CPC ........ *H01L 21/0228* (2013.01); *C23C 16/401* (2013.01); *C23C 16/4412* (2013.01); *C23C 16/45519* (2013.01); *H01L 21/02129* (2013.01)

(58) Field of Classification Search
CPC ........... H01L 21/0228; H01L 21/02129; H01L 21/28562; H01L 21/76834; C23C 16/401;
(Continued)

(56) References Cited

U.S. PATENT DOCUMENTS 11,393,719 B2 7/2022 Ogawa
2011/0266466 A1* 11/2011 Hautala .............. H01J 37/3178
250/492.21
(Continued)

FOREIGN PATENT DOCUMENTS

CN 103144024 A 6/2013
CN 111826631 A 10/2020
(Continued)

OTHER PUBLICATIONS

Taiwan Office Action dated Aug. 2, 2023 for Taiwan Patent Application No. 111126579.
(Continued)

*Primary Examiner* — Caleen O Sullivan
(74) *Attorney, Agent, or Firm* — Volpe Koenig

(57) ABSTRACT

There is provided a technique that includes: (a) supplying a metal element-containing gas to a substrate accommodated in a process vessel; (b) supplying a reducing gas to the substrate; (c) performing (a) and (b) a predetermined number of times to form a film containing a metal element on the substrate; (d) supplying a modifying gas to the film to form a layer including an element contained in the modifying gas on a surface of the film after (c); and (e) creating a rare gas atmosphere in the process vessel and in a transfer chamber adjacent to the process vessel and carrying the substrate out of the process vessel and into the transfer chamber after (d).

13 Claims, 6 Drawing Sheets

(51) Int. Cl.
*C23C 16/44* (2006.01)
*C23C 16/455* (2006.01)

(58) Field of Classification Search
CPC .......... C23C 16/4412; C23C 16/45519; C23C 16/14; C23C 16/45525
USPC .......................................................... 438/607
See application file for complete search history.

(56) References Cited

U.S. PATENT DOCUMENTS

| | | | |
|---|---|---|---|
| 2014/0110790 A1 | 4/2014 | Huang et al. | |
| 2018/0294187 A1 | 10/2018 | Thombare et al. | |
| 2018/0342395 A1 | 11/2018 | Hung et al. | |
| 2019/0172707 A1* | 6/2019 | Umehara | H01L 21/02219 |
| 2020/0211858 A1 | 7/2020 | Nakayama et al. | |
| 2020/0332416 A1 | 10/2020 | Fluit | |

FOREIGN PATENT DOCUMENTS

| | | | |
|---|---|---|---|
| CN | 112117182 | A | 12/2020 |
| JP | 02-012913 | A | 1/1990 |
| JP | 2000031119 | A | 1/2000 |
| JP | 2010-080737 | A | 4/2010 |
| JP | 2016-098406 | A | 5/2016 |
| JP | 2019-102780 | A | 6/2019 |
| JP | 2020-180332 | A | 11/2020 |
| KR | 2014-0100560 | A | 8/2014 |
| KR | 20150076654 | A | 7/2015 |
| KR | 2020-0028435 | A | 3/2020 |
| WO | 2018/218078 | A1 | 11/2018 |
| WO | 2019/065544 | A1 | 4/2019 |

OTHER PUBLICATIONS

Korean Office Action issued on May 22, 2023 for Korean Patent Application No. 10-2022-0089383.

Japanese Office Action issued on May 9, 2023 for Japanese Patent Application No. 2021-151868.

Chinese Office Action issued on Dec. 15, 2025 for Chinese Patent Application No. 202210864560.6.

* cited by examiner

METHOD OF PROCESSING SUBSTRATE, RECORDING MEDIUM, SUBSTRATE PROCESSING APPARATUS AND METHOD OF MANUFACTURING SEMICONDUCTOR DEVICE

CROSS-REFERENCE TO RELATED APPLICATION

This application is based upon and claims the benefit of priority from Japanese Patent Application No. 2021-151868, filed on Sep. 17, 2021, the entire contents of which are incorporated herein by reference.

FIELD

The present disclosure relates to a method of processing substrate, recording medium, a substrate processing apparatus, and a method of manufacturing a semiconductor device.

BACKGROUND

For example, a low-resistance tungsten (W) film is used as a word line of a NAND flash memory or a DRAM having a three-dimensional structure. In addition, in some cases, for example, a titanium nitride (TiN) film is used as a barrier film between the W film and an insulating film.

SUMMARY

According to some aspects of the present disclosure, there is provided a substrate processing method including: (a) supplying a metal element-containing gas to a substrate accommodated in a process vessel; (b) supplying a reducing gas to the substrate; (c) performing (a) and (b) a predetermined number of times to form a film containing a metal element on the substrate; (d) supplying a modifying gas to the film to form a layer including an element contained in the modifying gas on a surface of the film after (c); and (e) creating a rare gas atmosphere in the process vessel and in a transfer chamber adjacent to the process vessel and carrying the substrate out of the process vessel and into the transfer chamber after (d).

DETAILED DESCRIPTION

Figure 1:
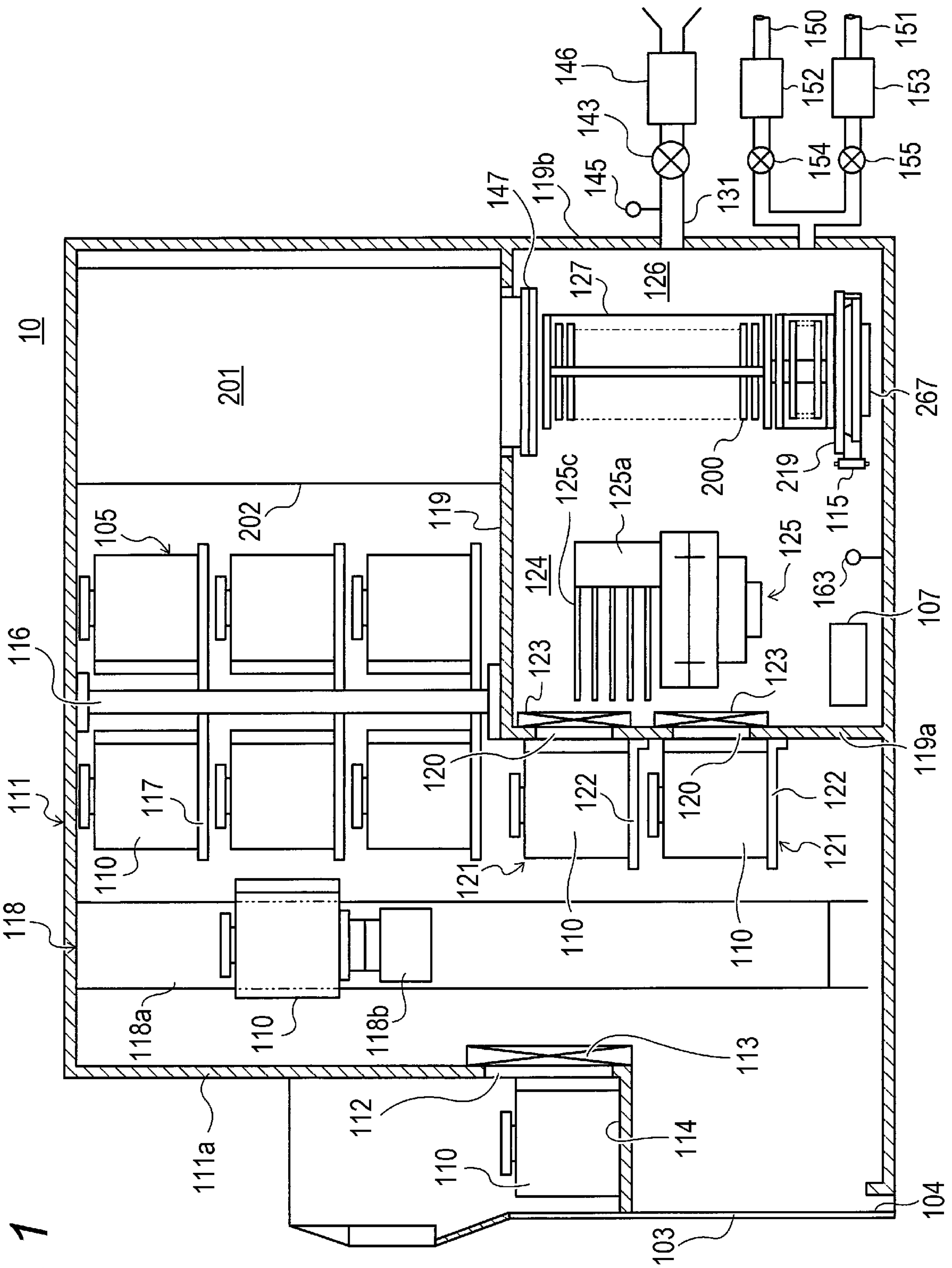
FIG. 1 is a schematic diagram illustrating a configuration of a substrate processing apparatus preferably used in an embodiment of the present disclosure.

It is difficult to perform etching with an increase in the number of layers in the NAND flash memory having the three-dimensional structure. Therefore, a task is to thin the word line.

In order to achieve the task, instead of using the TiN film and the W film, for example, there is a technique which reduces the thickness and resistance of a film, using a film containing molybdenum (Mo). However, in some cases, at least one of nitrogen (N) and oxygen (O) is mixed in the Mo film or is adsorbed on a surface of the Mo film, resulting in an increase in the resistance of the Mo film.

Embodiments of the Present Disclosure

Hereinafter, some embodiments of the present disclosure will be described with reference to the drawings. In addition, all of the drawings used in the following description are schematic, and dimensional relationships between elements, ratios between the elements, and the like illustrated in the drawings do not necessarily coincide with actual dimensional relationships and ratios. Further, even among a plurality of drawings, the dimensional relationships between the elements, the ratios of the elements, and the like do not necessarily coincide with each other.

[Configuration of Substrate Processing Apparatus]

First, a substrate processing apparatus 10 carried out by the present disclosure will be described with reference to FIG. 1. The substrate processing apparatus 10 includes a housing 111. A front maintenance port 103 serving as an opening portion which is provided such that maintenance can be performed is formed in a lower portion of a front wall 111*a* of the housing 111. The front maintenance port 103 is opened and closed by a front maintenance door 104.

A pod carrying-in and carrying-out port 112 is provided in the front wall 111*a* of the housing 111 such that the inside and outside of the housing 111 communicate with each other. The pod carrying-in and carrying-out port 112 is opened and closed by a front shutter 113. A load port (transfer container delivery stand) 114 is installed on the front side of the front surface of the pod carrying-in and carrying-out port 112. The load port 114 is configured to position a mounted pod 110.

The pod 110 is a closed-type substrate transfer container, is carried in on the load port 114 by an in-process transfer device (not illustrated), and is carried out of the load port 114.

A rotary pod shelf (transfer container storage shelf) 105 is installed above a substantially central portion of the housing 111 in a front-rear direction. The rotary pod shelf 105 is configured to store a plurality of pods 110.

The rotary pod shelf 105 includes a column 116 that is vertically provided and intermittently rotated and multi-stage shelf boards (transfer container mounting shelf) 117 that are radially supported by the column 116 at each position of the upper, middle, and lower stages. The shelf board 117 is configured to store a plurality of pods 110 in a state in which the pods 110 are placed thereon.

A pod opener (transfer container lid opening and closing mechanism) 121 is provided below the rotary pod shelf 105. The pod opener 121 is configured to have the pod 110 placed thereon and to open and close a lid of the pod 110.

A pod transfer mechanism (container transfer mechanism) 118 is installed between the load port 114, and the rotary pod shelf 105 and the pod opener 121. The pod transfer mechanism 118 is configured to hold the pod 110, to be raised and lowered, to be moved forward and backward in a horizontal direction, and to transfer the pod 110 between the load port 114, and the rotary pod shelf 105 and the pod opener 121.

A sub-housing 119 is provided below the substantially central portion of the housing 111 in the front-rear direction so as to extend to a rear end. A pair of wafer carrying-in and carrying-out ports (substrate carrying-in and carrying-out ports) 120 for carrying wafers 200 into and out of the sub-housing 119 are provided side by side in two upper and lower stages in a front wall 119*a* of the sub-housing 119. The pod opener 121 is provided for each of the upper and lower wafer carrying-in and carrying-out ports 120.

The pod opener 121 includes a mounting table 122 on which the pod 110 is placed and an opening and closing mechanism 123 for opening and closing the lid of the pod 110. The pod opener 121 is configured to open and close the lid of the pod 110 placed on the mounting table 122 with the opening and closing mechanism 123 to open and close a wafer port of the pod 110.

The sub-housing 119 constitutes a transfer chamber 124 that is airtight from a space (pod transfer space) in which the pod transfer mechanism 118 and the rotary pod shelf 105 are disposed. A wafer transfer mechanism (substrate transfer mechanism) 125 is installed in a front region of the transfer chamber 124. The wafer transfer mechanism 125 includes a required number of (5 in FIG. 1) wafer mounting plates 125*c* on which the wafers 200 are placed. The wafer mounting plates 125*c* can be moved directly in the horizontal direction, can be rotated in the horizontal direction, and can be raised and lowered. The wafer transfer mechanism 125 is configured to load and unload the wafer 200 to and from a boat (substrate holder) 217. When the wafer 200 is transferred from the pod 110 to the boat 217, the pod 110 comes into close contact with the wafer carrying-in and carrying-out port 120, and the inside of the pod 110 and the inside of the transfer chamber 124 have the same gas atmosphere.

A standby section 126 which accommodates the boat 217 in a standby state is configured in a rear region of the transfer chamber 124, and a vertical process furnace 202 is provided above the standby section 126. A process chamber 201 is formed in the process furnace 202. A lower end portion of the process chamber 201 is a furnace opening portion, and the furnace opening portion is opened and closed by a seal cap 219.

A boat elevator (substrate holder elevating mechanism) 115 for raising and lowering the boat 217 is installed between a right end of the housing 111 and a right end of the standby section 126 of the sub-housing 119. The seal cap 219 serving as a lid is horizontally attached to an arm 128 that is connected to an elevating table of the boat elevator 115. The seal cap 219 vertically supports the boat 217 and can airtightly close a furnace port shutter 147 in a state in which the boat 217 is loaded into the process chamber 201.

The boat 217 is configured to hold a plurality of (for example, about 50 to 125) wafers 200 in multiple stages in a horizontal posture with the centers thereof aligned with each other.

An exhaust pipe 131 for exhausting the atmosphere in the transfer chamber 124 is provided in a rear wall 119*b* of the sub-housing 119. A pressure sensor 145 serving as a pressure detector (pressure detection section) that detects the internal pressure of the transfer chamber 124, an auto pressure controller (APC) valve 143, and a vacuum pump 146 serving as a vacuum exhaust device are connected to the exhaust pipe 131 in this order from an upstream side. The APC valve 143 can be opened and closed in a state in which the vacuum pump 146 is operated to vacuum-exhaust the transfer chamber 124 and to stop the vacuum exhaust. In addition, in a state in which the vacuum pump 146 is operated, the degree of valve opening can be regulated to adjust the internal pressure of the transfer chamber 124. An exhaust system for the transfer chamber 124 and the pod 110 in close contact with the transfer chamber 124 is mainly configured by the exhaust pipe 131, the APC valve 143, and the pressure sensor 145. It may be considered that the vacuum pump 146 is included in the exhaust system.

Further, each of a gas supply pipe 150 for supplying an inert gas excluding a rare gas and a gas supply pipe 151 for supplying the rare gas is connected to the rear wall 119*b* of the sub-housing 119. An MFC 152 which is a flow rate controller (flow rate control section) and a valve 154 which is an on-off valve are provided in the gas supply pipe 150 in this order from the upstream side. In addition, an MFC 153 which is a flow rate controller (flow rate control section) and a valve 155 which is an on-off valve are provided in the gas supply pipe 151 in this order from the upstream side.

The inert gas excluding the rare gas is supplied from the gas supply pipe 150 into the transfer chamber 124 through the MFC 152 and the valve 154. For example, nitrogen ($N_2$) gas can be used as the inert gas excluding the rare gas. In a case in which the inert gas flows from the gas supply pipe 150, an inert gas supply system for the transfer chamber 124 and the pod 110 in close contact with the transfer chamber 124 is mainly configured by the gas supply pipe 150, the MFC 152, and the valve 154.

The rare gas is supplied from the gas supply pipe 151 into the transfer chamber 124 through the MFC 153 and the valve 155. For example, helium (He) gas, neon (Ne) gas, argon (Ar) gas, krypton (Kr) gas, xenon (Xe) gas, and the like can be used as the rare gas. In a case in which the rare gas flows from the gas supply pipe 151, a rare gas supply system for the transfer chamber 124 and the pod 110 in close contact with the transfer chamber 124 is mainly configured by the gas supply pipe 151, the MFC 153, and the valve 155.

Further, a temperature sensor 163 serving as a temperature detector is installed in the transfer chamber 124, and the amount of current supplied to a heater 107 is adjusted on the basis of temperature information detected by the temperature sensor 163 such that the internal temperature of the transfer chamber 124 has a desired temperature distribution. A heating system for the transfer chamber 124 is mainly configured by the heater 107.

Next, a configuration of the periphery of the process chamber 201 will be described with reference to FIGS. 2 and 3. The process chamber 201 includes the process furnace 202 provided with a heater 207 serving as a heating means (a heating mechanism and a heating system). The heater 207 has a cylindrical shape and is supported by a heater base (not illustrated) serving as a holding plate to be vertically installed.

An outer tube 203 that is provided concentrically with the heater 207 and constitutes a reaction vessel (process vessel) is provided inside the heater 207. For example, the outer tube 203 is made of a heat-resistant material, such as quartz ($SiO_2$) or silicon carbide (SiC), and is formed in a cylindrical shape in which an upper end is closed and a lower end is open. A manifold (inlet flange) 209 is provided below the outer tube 203 so as to be concentric with the outer tube 203. For example, the manifold 209 is made of metal, such as stainless steel (SUS), and is formed in a cylindrical shape in which an upper end and a lower end are open. An O-ring 220*a* serving as a sealing member is provided between an upper end portion of the manifold 209 and the outer tube 203. The manifold 209 is supported by the heater base such that the outer tube 203 is vertically installed.

An inner tube 204 constituting the reaction vessel is provided inside the outer tube 203. For example, the inner tube 204 is made of a heat-resistant material, such as quartz ($SiO_2$) or silicon carbide (SiC), and is formed in a cylindrical shape in which an upper end is closed and a lower end is open. The process vessel (reaction vessel) is configured by at least the outer tube 203 and the manifold 209. The inner tube 204 may be included in the process vessel. The process chamber 201 is formed in a hollow portion of the process vessel (inside the inner tube 204).

The process chamber 201 is configured to accommodate the wafers 200 serving as substrates in a state in which the wafers 200 are arranged in a horizontal posture in multiple stages in the vertical direction by the boat 217 which will be described below.

Nozzles 410, 420, and 430 are provided in the process chamber 201 so as to pass through a side wall of the manifold 209 and the inner tube 204. Gas supply pipes 310, 320, and 330 are connected to the nozzles 410, 420, and 430, respectively. However, the process furnace 202 according to this embodiment is not limited to the above-mentioned form.

Mass flow controllers (MFCs) 312, 322, and 332, which are flow rate controllers (flow rate control sections), are provided in the gas supply pipes 310, 320, and 330 in this order from the upstream side, respectively. In addition, valves 314, 324, and 334, which are on-off valves, are provided in the gas supply pipes 310, 320, and 330, respectively. Further, gas supply pipes 510, 520, and 530 for supplying the inert gas excluding the rare gas and gas supply pipes 511, 521, and 531 for supplying the rare gas are connected to the downstream sides of the valves 314, 324, and 334 of the gas supply pipes 310, 320, and 330, respectively.

MFCs 512, 522, and 532, which are flow rate controllers (flow rate control sections), and valves 514, 524, and 534, which are on-off valves, are provided in the gas supply pipes 510, 520, and 530 in this order from the upstream side, respectively. In addition, MFCs 513, 523, and 533, which are flow rate controllers (flow rate control sections), and valves 515, 525, and 535, which are on-off valves, are provided in the gas supply pipes 511, 521, and 531 in this order from the upstream side, respectively.

The nozzles 410, 420, and 430 are connected to tip portions of the gas supply pipes 310, 320, and 330, respectively. The nozzles 410, 420, and 430 are configured as L-shaped nozzles and have horizontal portions that are provided so as to pass through the side wall of the manifold 209 and the inner tube 204. Vertical portions of the nozzles 410, 420, and 430 are provided inside a channel-shaped (groove-shaped) preliminary chamber 201*a* which is formed so as to project outwardly in a radial direction of the inner tube 204 and to extend in the vertical direction. The vertical portions are provided in the preliminary chamber 201*a* so as to extend to the upper side (the upper side in the arrangement direction of the wafers 200) along the inner wall of the inner tube 204.

The nozzles 410, 420, and 430 are provided so as to extend from a lower region of the process chamber 201 to an upper region of the process chamber 201 and have a plurality of gas supply holes 410*a*, 420*a*, 430*a* that are provided at positions facing the wafers 200, respectively. Therefore, a process gas is supplied from each of the gas supply holes 410*a*, 420*a*, and 430*a* of the nozzles 410, 420, and 430 to the wafers 200. A plurality of gas supply holes 410*a*, 420*a*, and 430*a* are provided from a lower portion of the inner tube 204 to an upper portion thereof, have the same opening area, and are provided at the same opening pitch. However, the gas supply holes 410*a*, 420*a*, and 430*a* are not limited to the above-mentioned form. For example, the opening area may be gradually increased from the lower portion to the upper portion of the inner tube 204. This makes it possible to make the flow rate of the gas supplied from the gas supply holes 410*a*, 420*a*, and 430*a* more uniform.

The plurality of gas supply holes 410*a*, 420*a*, and 430*a* of the nozzles 410, 420, and 430 are provided at height positions from the lower portion to the upper portion of the boat 217, which will be described below. Therefore, the process gas supplied from the gas supply holes 410*a*, 420*a*, and 430*a* of the nozzles 410, 420, and 430 into the process chamber 201 is supplied to the entire regions of the wafers 200 accommodated from the lower portion to the upper portion of the boat 217. The nozzles 410, 420, and 430 may be provided so as to extend from the lower region to the upper region of the process chamber 201 and are preferably provided so as to extend to the vicinity of a ceiling of the boat 217.

A metal element-containing gas is supplied as the process gas from the gas supply pipe 310 into the process chamber 201 through the MFC 312, the valve 314, and the nozzle 410. For example, a molybdenum (Mo)-containing gas, a ruthenium (Ru)-containing gas, a tungsten (W)-containing gas, and the like can be used as the metal element-containing gas.

In a case in which the metal element-containing gas flows from the gas supply pipe 310, a metal element-containing gas supply system for the process chamber 201 is mainly configured by the gas supply pipe 310, the MFC 312, and the valve 314. However, it may be considered that the nozzle 410 is included in the metal element-containing gas supply system.

The reducing gas is supplied as the process gas from the gas supply pipe 320 into the process chamber 201 through the MFC 322, the valve 324, and the nozzle 420. For example, hydrogen ($H_2$) gas, deuterium ($D_2$) gas, gas containing activated hydrogen, and the like can be used as the reducing gas.

In a case in which the reducing gas flows from the gas supply pipe 320, a reducing gas supply system for the process chamber 201 is mainly configured by the gas supply pipe 320, the MFC 322, and the valve 324. It may be considered that the nozzle 420 is included in the reducing gas supply system.

A modifying gas is supplied as the process gas from the gas supply pipe 330 into the process chamber 201 through the MFC 332, the valve 334, and the nozzle 430. For example, one type of gas among hydrogenated silicon gas, chlorosilane-based gas, oxygen (O)-containing gas, nitrogen (N)-containing gas, boron (B)-containing gas, fluorine (F)-containing gas, phosphorus (P)-containing gas, and the like or a mixed gas containing at least one of them can be used as the modifying gas.

In a case in which the modifying gas flows from the gas supply pipe 330, a modifying gas supply system for the process chamber 201 is mainly configured by the gas supply pipe 330, the MFC 332, and the valve 334. It may also be considered that the nozzle 430 is included in the modifying gas supply system.

The inert gas excluding the rare gas is supplied from the gas supply pipes 510, 520, and 530 into the process chamber 201 through the MFCs 512, 522, and 532, the valves 514, 524, and 534, and the nozzles 410, 420, and 430, respectively. For example, nitrogen ($N_2$) gas can be used as the inert gas excluding the rare gas.

In a case in which the inert gas flows from the gas supply pipes 510, 520, and 530, an inert gas supply system for the process chamber 201 is mainly configured by the gas supply pipes 510, 520, and 530, the MFCs 512, 522, and 532, the valves 514, 524, and 534, and the gas supply pipes 310, 320, and 330. It may also be considered that the nozzles 410, 420, and 430 are included in the inert gas supply system.

The rare gas is supplied from the gas supply pipes 511, 521, and 531 into the process chamber 201 through the MFCs 513, 523, and 533, the valves 515, 525, and 535, and the nozzles 410, 420, and 430, respectively. For example, helium (He) gas, neon (Ne) gas, argon (Ar) gas, krypton (Kr) gas, xenon (Xe) gas, and the like can be used as the rare gas.

In a case in which the rare gas flows from the gas supply pipes 511, 521, and 531, a rare gas supply system for the process chamber 201 is mainly configured by the gas supply pipes 511, 521, and 531, the MFCs 513, 523, and 533, the valves 515, 525, and 535, and the gas supply pipes 310, 320, and 330. It may also be considered that the nozzles 410, 420, and 430 are included in the rare gas supply system.

A gas supply method according to this embodiment transfers gas through the nozzles 410, 420, and 430 disposed in the preliminary chamber 201*a* in a vertically long space having an annular shape which is defined by the inner wall of the inner tube 204 and the end portions of a plurality of wafers 200. Then, gas is ejected into the inner tube 204 from the plurality of gas supply holes 410*a*, 420*a*, and 430*a* of the nozzles 410, 420, and 430 which are provided at the positions facing the wafers. More specifically, for example, the process gas is ejected in a direction parallel to the surfaces of the wafers 200 through the gas supply hole 410*a* of the nozzle 410, the gas supply hole 420*a* of the nozzle 420, and the gas supply hole 430*a* of the nozzle 430.

An exhaust hole (exhaust port) 204*a* is a through-hole that is formed at a position facing the nozzles 410 and 420 in the side wall of the inner tube 204 and is, for example, a slit-shaped through-hole that is provided so as to be elongated in the vertical direction. The gas, which has been supplied into the process chamber 201 from the gas supply holes 410*a* and 420*a* of the nozzles 410 and 420 and has flowed on the surface of the wafer 200, flows into an exhaust passage 206 which is a gap formed between the inner tube 204 and the outer tube 203 through the exhaust hole 204*a*. Then, the gas has flowed into the exhaust passage 206 flows into the exhaust pipe 231 and is discharged to the outside of the process furnace 202.

The exhaust hole 204*a* is provided at a position facing the plurality of wafers 200. The gas supplied from the gas supply holes 410*a* and 420*a* to the vicinity of the wafer 200 in the process chamber 201 flows in the horizontal direction and then flows into the exhaust passage 206 through the exhaust hole 204*a*. The exhaust hole 204*a* is not limited to the case in which it is configured as a slit-shaped through-hole and may be configured by a plurality of holes.

An exhaust pipe 231 for exhausting the atmosphere in the process chamber 201 is provided in the manifold 209. A pressure sensor 245 serving as a pressure detector (pressure detection section) that detects the internal pressure of the process chamber 201, an auto pressure controller (APC) valve 243, and a vacuum pump 246 serving as a vacuum exhaust device are connected to the exhaust pipe 231 in this order from the upstream side. The APC valve 243 can be opened and closed in a state in which the vacuum pump 246 is operated to vacuum-exhaust the process chamber 201 and to stop the vacuum exhaust. In addition, in a state in which the vacuum pump 246 is operated, the degree of valve opening can be regulated to adjust the internal pressure of the process chamber 201. An exhaust system for the process chamber 201 is mainly configured by the exhaust hole 204*a*, the exhaust passage 206, the exhaust pipe 231, the APC valve 243, and the pressure sensor 245. It may be considered that the vacuum pump 246 is included in the exhaust system.

The seal cap 219 serving as a furnace port lid that can airtightly close a lower end opening of the manifold 209 is provided below the manifold 209. The seal cap 219 is configured to come into contact with a lower end of the manifold 209 from the lower side in the vertical direction. For example, the seal cap 219 is made of metal, such as SUS, and is formed in a disk shape. An O-ring 220*b* serving as a seal member that comes into contact with the lower end of the manifold 209 is provided on an upper surface of the seal cap 219. A rotation mechanism 267 that rotates the boat 217 accommodating the wafers 200 is provided on a side of the seal cap 219 which is opposite to the process chamber 201. A rotation shaft 255 of the rotation mechanism 267 is connected to the boat 217 through the seal cap 219. The rotation mechanism 267 is configured to rotate the boat 217 to rotate the wafers 200.

The seal cap 219 is configured to be vertically raised and lowered by the boat elevator 115 serving as an elevating mechanism which is vertically provided outside the outer tube 203. The boat elevator 115 is configured to raise and lower the seal cap 219 such that the boat 217 can be carried into or carried out of the process chamber 201. The boat elevator 115 is configured as a transfer device that transfers the boat 217 and the wafers 200 accommodated in the boat 217 into and out of the process chamber 201. A transfer system is mainly configured by the boat elevator 115 and the wafer transfer mechanism 125.

The boat 217 serving as a substrate support is configured such that a plurality of wafers 200, for example, 25 to 200 wafers 200 are arranged in a horizontal posture at intervals in the vertical direction with the centers thereof aligned with each other. The boat 217 is made of, for example, a heat-resistant material such as quartz or SiC. In a lower portion of the boat 217, for example, a heat insulating plate 218 made of a heat-resistant material, such as quartz or SiC, is supported in a horizontal posture in multiple stages (not illustrated). This configuration makes it difficult for heat from the heater 207 to be transferred to the seal cap 219. However, this embodiment is not limited to the above-mentioned form. For example, instead of providing the heat insulating plate 218 in the lower portion of the boat 217, a heat insulating cylinder that is configured as a cylindrical member made of a heat-resistant material, such as quartz or SiC, may be provided.

Figure 3:
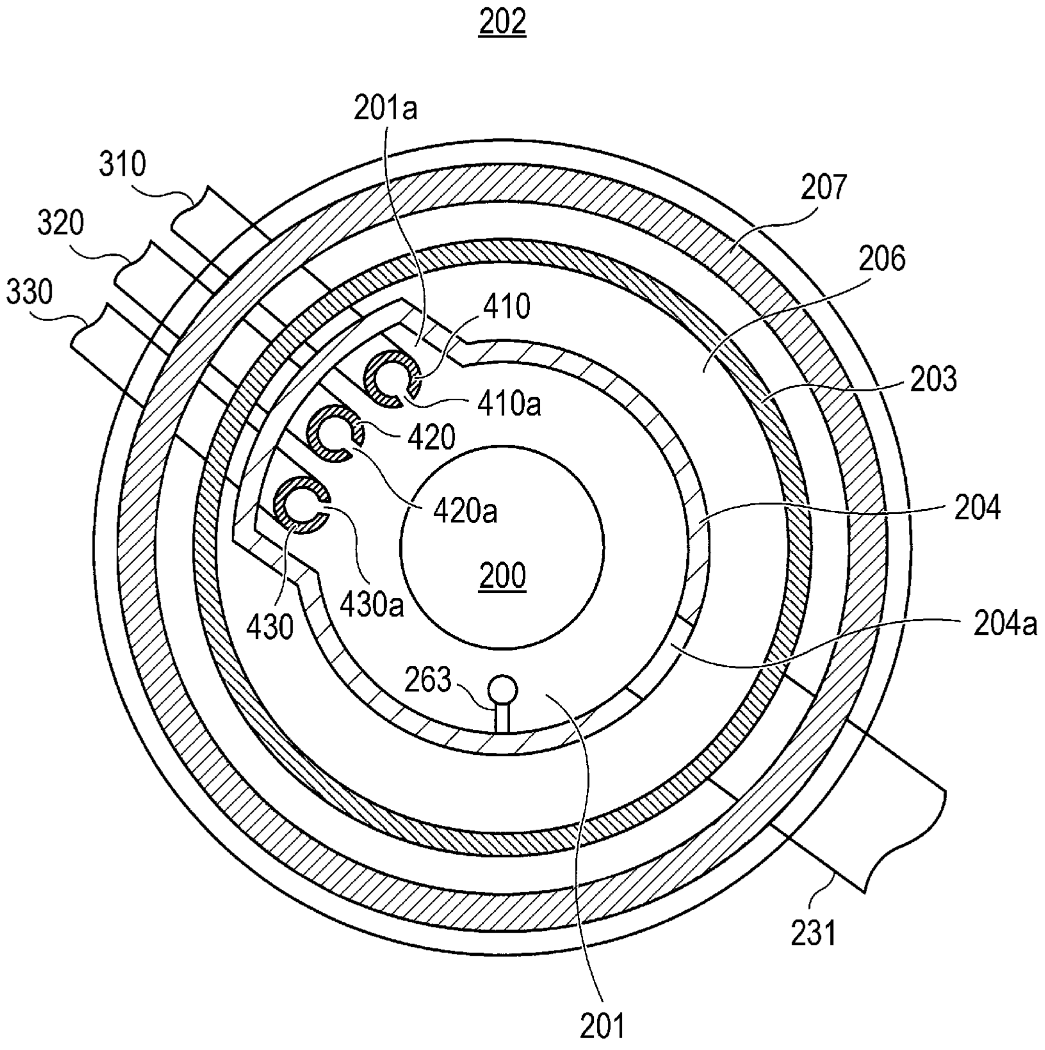
FIG. 3 is a schematic cross-sectional view taken along the line AA of FIG. 2.

As illustrated in FIG. 3, a temperature sensor 263 serving as a temperature detector is provided in the inner tube 204, and the amount of current supplied to the heater 207 is adjusted on the basis of temperature information detected by the temperature sensor 263 such that the internal temperature of the process chamber 201 has a desired temperature distribution. The temperature sensor 263 is formed in an L-shape similarly to the nozzles 410, 420, and 430 and is provided along the inner wall of the inner tube 204. A heating system for the process chamber 201 is mainly configured by the heater 207.

Figure 4:
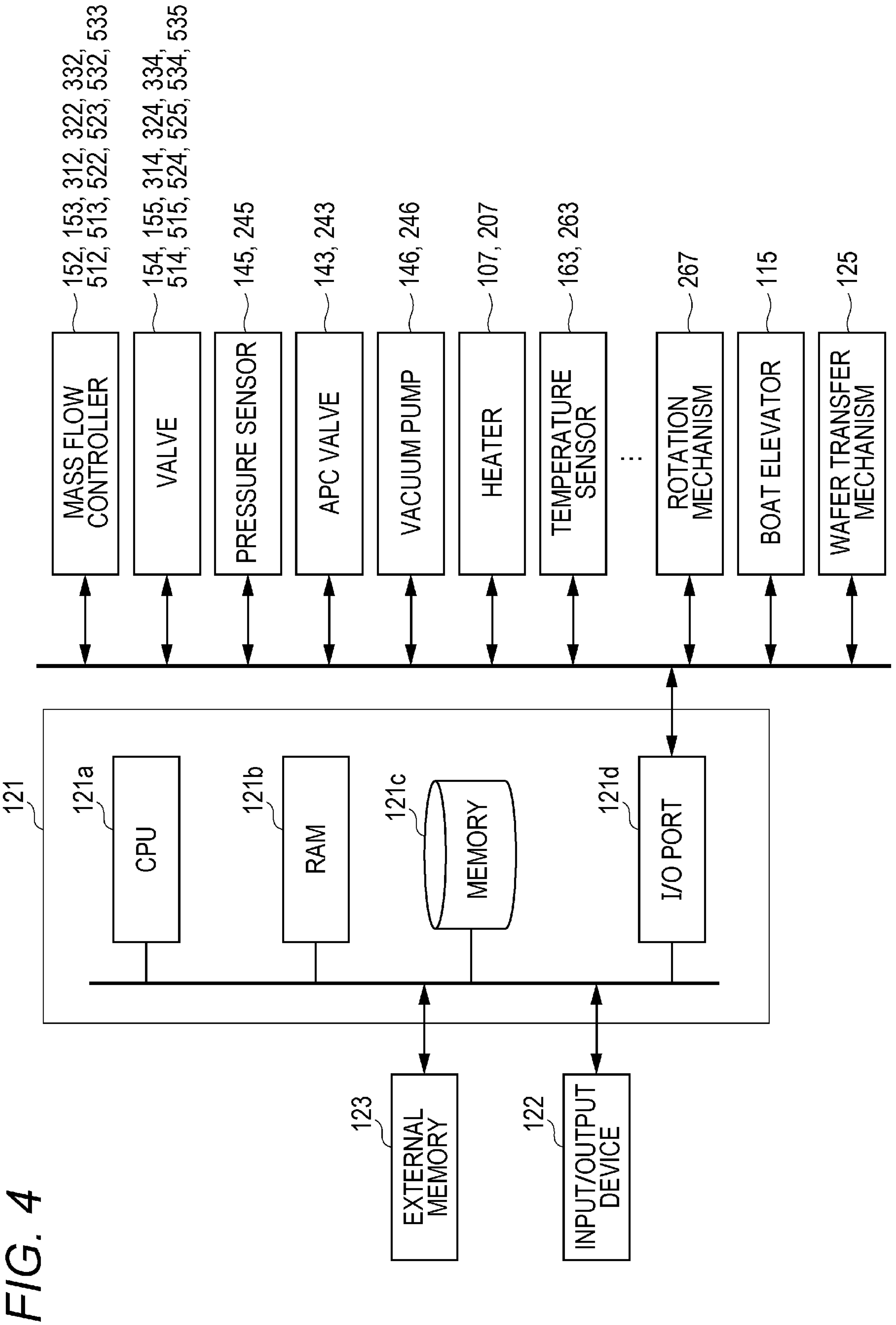
FIG. 4 is a schematic diagram illustrating a configuration of a controller of the substrate processing apparatus according to the embodiment of the present disclosure and is a block diagram illustrating a control system of the controller.

As illustrated in FIG. 4, a controller 121, which is a control section, is configured as a computer including a central processing unit (CPU) 121*a*, a random access memory (RAM) 121*b*, a memory 121*c*, and an I/O port 121*d*. The RAM 121*b*, the memory 121*c*, and the I/O port 121*d* are configured to exchange data with the CPU 121*a* through an internal bus. An input/output device 122 that is configured as, for example, a touch panel is connected to the controller 121.

The memory 121*c* is configured as, for example, a flash memory or a hard disk drive (HDD). For example, a control program for controlling the operation of the substrate processing apparatus and a process recipe, in which the procedures, conditions, and the like of a method of manufacturing a semiconductor device, which will be described below, are described, are stored in the memory 121*c* such that they can be read from the memory 121*c*. The process recipes are combined such that the controller 121 can execute each process (each step) of the method of manufacturing a semiconductor device, which will be described below, to obtain a predetermined result and function as programs. Hereinafter, the process recipe, the control program, and the like are collectively and simply referred to as a program. In a case in which the term "program" is used in this specification, it may include only the process recipe, may include only the control program, and may include a combination of the process recipe and the control program. The RAM 121*b* is configured as a memory area (work area) in which the program, data, and the like read by the CPU 121*a* are temporarily stored.

The I/O port 121*d* is connected to, for example, the MFCs 152, 153, 312, 322, 332, 512, 513, 522, 523, 532, and 533, the valves 154, 155, 314, 324, 334, 514, 515, 524, 525, 534, and 535, the pressure sensors 145 and 245, the APC valves 143 and 243, the vacuum pumps 146 and 246, the heaters 107 and 207, the temperature sensors 163 and 263, the rotation mechanism 267, the boat elevator 115, and the wafer transfer mechanism 125.

The CPU 121*a* is configured to read the control program from the memory 121*c* and to read the recipe or the like from the memory 121*c* in response to the input of an operation command from the input/output device 122 or the like. The CPU 121*a* is configured to be capable of controlling, for example, the flow rate adjustment operation of various types of gases by the MFCs 152, 153, 312, 322, 332, 512, 513, 522, 523, 532, and 533, the opening and closing operation of the valves 154, 155, 314, 324, 334, 514, 515, 524, 525, 534, and 535, the opening and closing operation of the APC valves 143 and 243 and the pressure adjustment operation of the APC valves 143 and 243 based on the pressure sensors 145 and 245, the temperature adjustment operation of the heaters 107 and 207 based on the temperature sensors 163 and 263, the start and stop of the vacuum pumps 146 and 246, the rotation and rotation speed adjustment operation of the boat 217 by the rotation mechanism 267, the raising and lowering operation of the boat 217 by the boat elevator 115, and the transfer operation of the wafer 200 between the pod 110 and the boat 217 by the wafer transfer mechanism 125 according to the content of the read recipe.

The controller 121 can be configured by installing the above-mentioned program stored in an external memory (for example, a magnetic tape, a magnetic disk, such as a flexible disk or a hard disk, an optical disk, such as a CD or a DVD, a magneto-optical disk, such as an MO, or a semiconductor memory, such as a USB memory or a memory card) 123 in a computer. The memory 121*c* and the external memory 123 are configured as computer-readable recording media. Hereinafter, the memory 121*c* and the external memory 123 are collectively and simply referred to as recording media. In this specification, the term "recording medium" may include only the memory 121*c*, may include only the external memory 123, or may include both the memory 121*c* and the external memory 123. The program may be provided to the computer using a communication means, such as the Internet or a dedicated line, without using the external memory 123.

[Substrate Processing Process]

Figure 5:
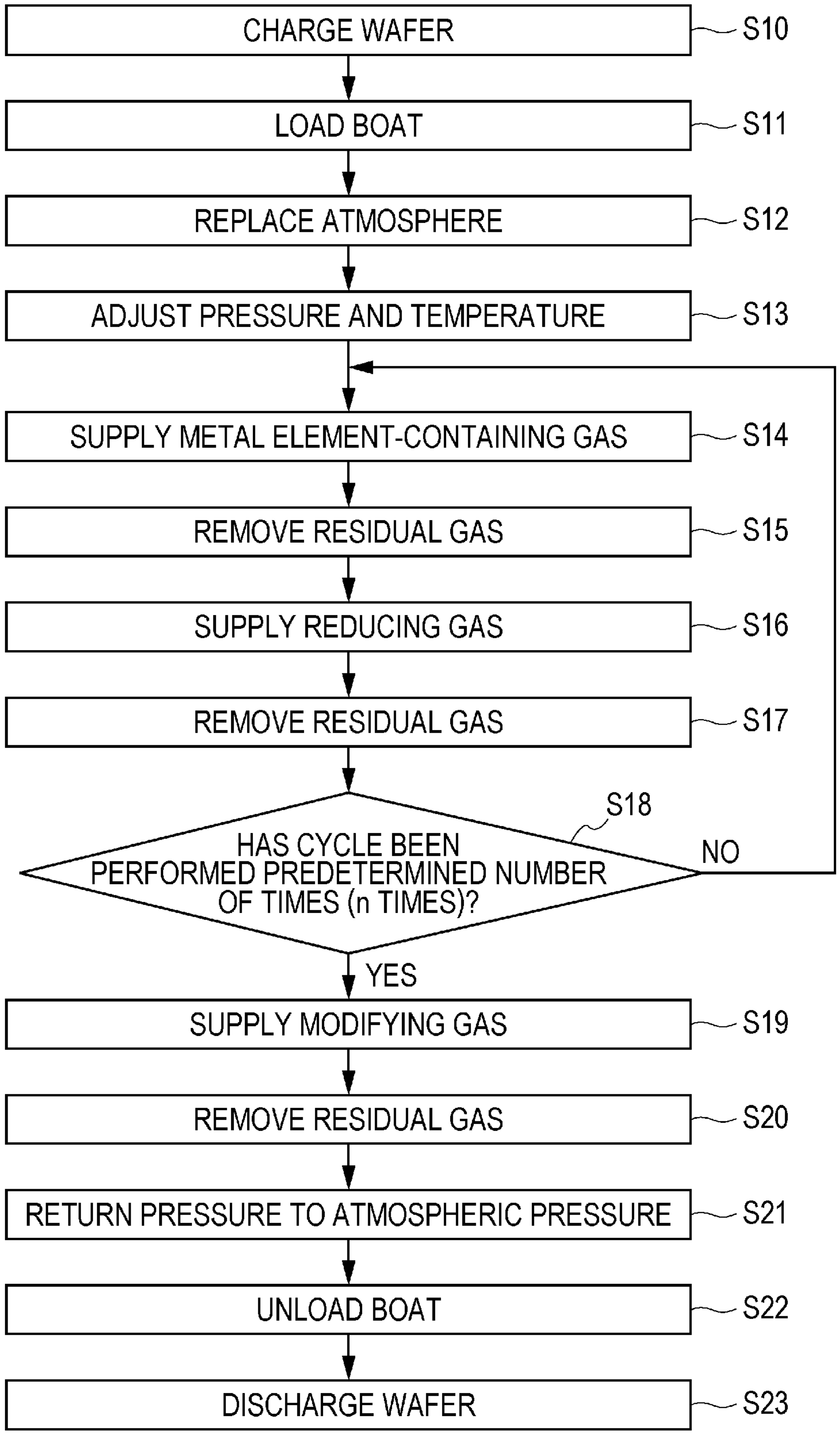
FIG. 5 is a diagram illustrating a substrate processing process according to the embodiment of the present disclosure.
Figure 6A:
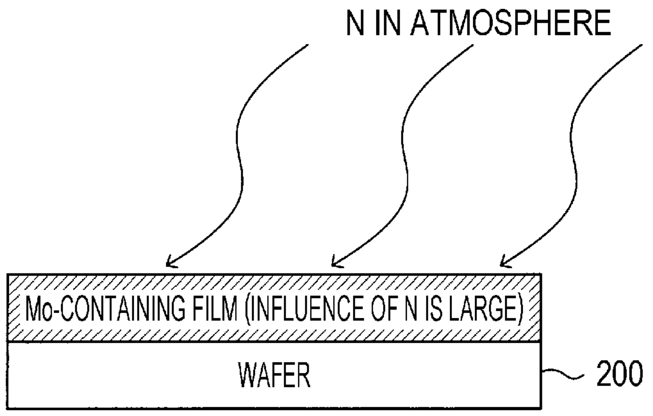
FIG. 6A is a diagram illustrating a state before a Si cap layer is formed on a Mo-containing film.
Figure 6B:
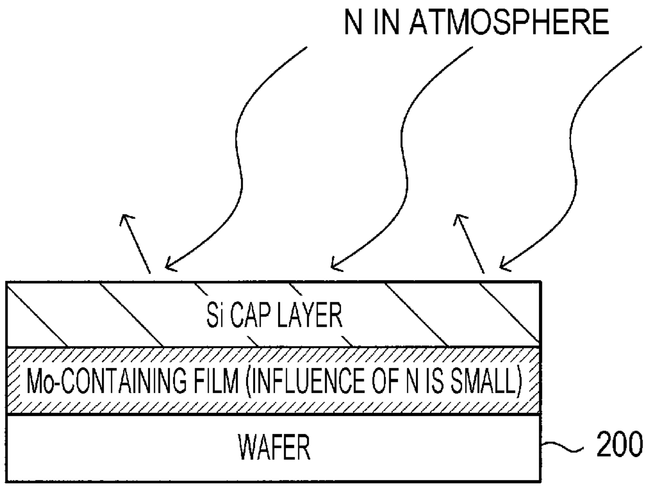
FIG. 6B is a diagram illustrating a state after the Si cap layer is formed on the Mo-containing film.

As one step of a process of manufacturing a semiconductor device (device), an example of a step of forming a Mo-containing film used as a control gate electrode of, for example, a 3D NAND on the wafer 200 will be described with reference to FIGS. 5, 6A, and 6B. Here, as illustrated in FIG. 6B, a silicon (Si) cap film is formed on the wafer 200 having the Mo-containing film formed on a surface thereof as illustrated in FIG. 6A. In the following description, the operation of each section constituting the substrate processing apparatus 10 is controlled by the controller 121.

The substrate processing process (the process of manufacturing a semiconductor device) according to this embodiment includes:

(a) supplying the metal element-containing gas to the wafer 200 accommodated in the process chamber 201;
(b) supplying the reducing gas to the wafer 200;
(c) performing (a) and (b) a predetermined number of times to form a film containing a metal element on the wafer 200;
(d) supplying the modifying gas to the film containing the metal element to form a layer including an element contained in the modifying gas on a surface of the film after (c); and
(e) creating a rare gas atmosphere in the process chamber 201 and the transfer chamber 124 and carrying the wafer 200 out of the process chamber 201 and into the transfer chamber 124 after (d).

In a case in which the term "wafer" is used in this specification, it may mean "only the wafer" or may mean "a laminated body of the wafer and a predetermined layer, film, or the like formed on a surface of the wafer". In this specification, in a case in which the term "surface of the wafer" is used, it may mean "a surface of the wafer" or "a surface of a predetermined layer, film, or the like formed on the wafer". In this specification, in a case in which the term "substrate" is used, it is synonymous with the term "wafer".

[Carrying-In of Wafer]

The valves 154, 314, 324, and 334 are opened to allow nitrogen ($N_2$) gas, which is the inert gas other than the rare gas, to flow into the gas supply pipes 150, 310, 320, and 330. The flow rate of the $N_2$ gas is adjusted by the MFCs 152, 512, 522, and 532, and the $N_2$ gas is supplied into the process chamber 201, the transfer chamber 124, and the pod 110 in close contact with the transfer chamber 124.

In a state in which the process chamber 201, the transfer chamber 124, and the pod 110 in close contact with the transfer chamber 124 are in the $N_2$ gas atmosphere, a plurality of wafers 200 are transferred from the pod 110 to the boat 217 (wafer charging (Step S10)).

Figure 2:
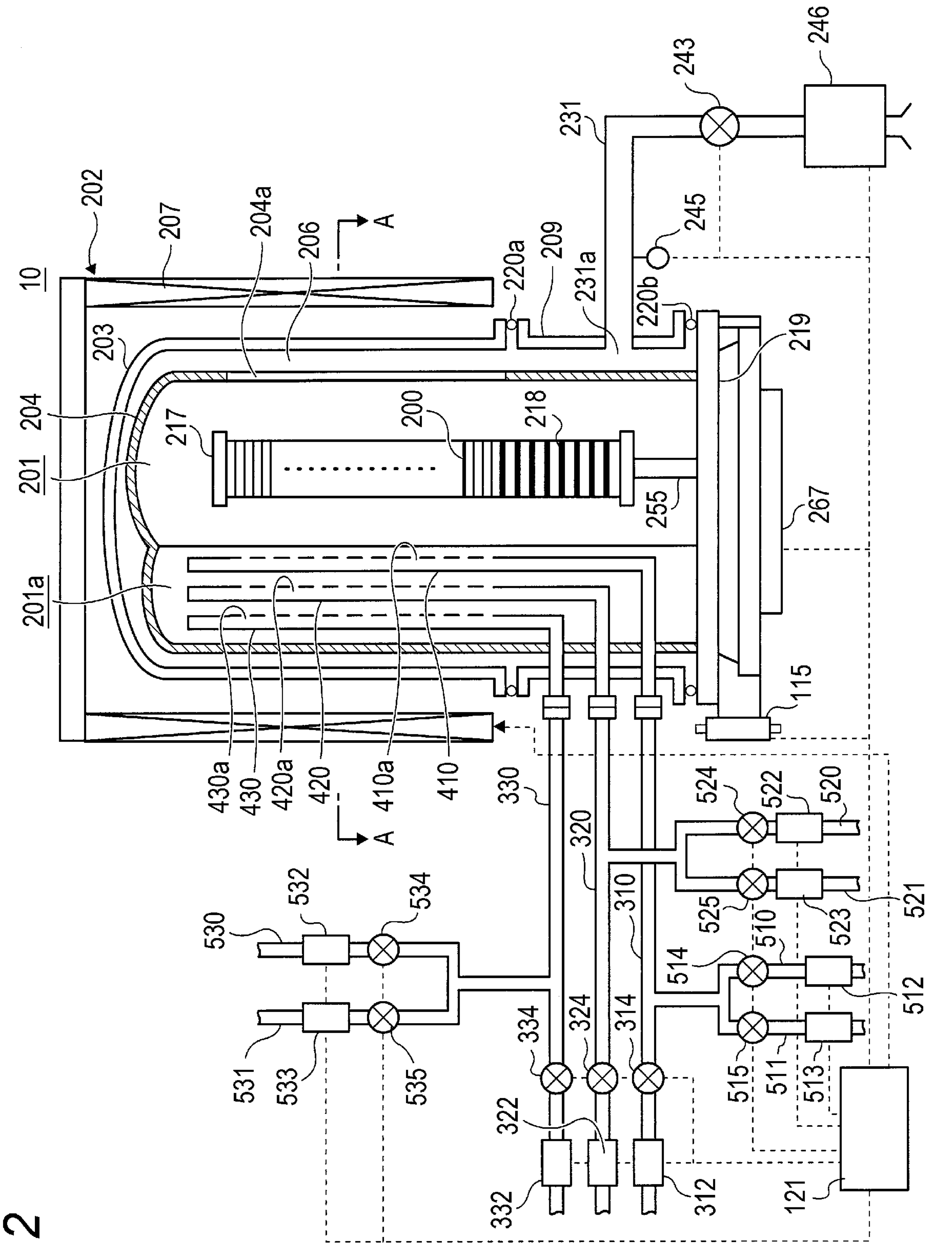
FIG. 2 is a sectional elevational view illustrating a process furnace of the substrate processing apparatus according to the embodiment of the present disclosure.

Then, as illustrated in FIG. 2, the boat 217 supporting the plurality of wafers 200 is raised by the boat elevator 115, carried into the process chamber 201 (boat loading (Step S11)), and accommodated in the process vessel. In this state, the seal cap 219 closes the lower end opening of the outer tube 203 through the O-ring 220.

Then, the APC valve 143 of the exhaust pipe 131 provided in the transfer chamber 124 is opened, and the vacuum pump 146 vacuum-exhausts the transfer chamber 124 and the pod 110 in close contact with the transfer chamber 124 to remove the $N_2$ gas remaining in the transfer chamber 124 and the pod 110 from the transfer chamber 124 and the pod 110. Then, the APC valve 143 is closed, and the valve 155 is opened such that Ar gas, which is the rare gas, flows to the gas supply pipe 151 to replace the inside of the transfer chamber 124 and the inside of the pod 110 with an Ar gas atmosphere (atmosphere replacement (Step S12)). In addition, the replacement of the atmosphere in the transfer chamber 124 and the pod 110 is not necessarily performed immediately after Step S11 and may be performed until boat unloading in Step S22 which will be described below.

[Pressure Adjustment and Temperature Adjustment (Step S13)]

The vacuum pump 246 performs vacuum exhaust such that the inside of the process chamber 201, that is, a space in which the wafers 200 are present has a predetermined pressure (degree of vacuum). At this time, the internal pressure of the process chamber 201 is measured by the pressure sensor 245, and the APC valve 243 is feedback-controlled on the basis of the measured pressure information (pressure adjustment). The vacuum pump 246 is maintained in a constantly operated state at least until the process on the wafer 200 is completed.

Further, the inside of the process chamber 201 is heated to a desired temperature by the heater 207. At this time, the amount of current applied to the heater 207 is feedback-controlled on the basis of the temperature information detected by the temperature sensor 263 such that the inside of the process chamber 201 has a desired temperature distribution (temperature adjustment). At this time, the temperature of the heater 207 is set such that the temperature of the wafer 200 is in a range of, for example, 300° C. to 650° C. Furthermore, the heating of the inside of the process chamber 201 by the heater 207 is continuously performed until at least the process on the wafer 200 is completed, that is, until Step S20, and the internal temperature of the process chamber 201 is kept constant.

[Supply of Metal Element-Containing Gas (Step S14)]

The valve 314 is opened to allow the metal element-containing gas, which is a raw material gas, to flow into the gas supply pipe 310. The flow rate of the metal element-containing gas is adjusted by the MFC 312. Then, the metal element-containing gas is supplied from the gas supply hole 410*a* of the nozzle 410 into the process chamber 201 and is exhausted from the exhaust pipe 231. At this time, the metal element-containing gas is supplied to the wafers 200.

At this time, the valve 515 is opened at the same time, and Ar gas, which is the rare gas, flows into the gas supply pipe 511. The flow rate of the Ar gas flowing through the gas supply pipe 511 is adjusted by the MFC 513. Then, the Ar gas is supplied into the process chamber 201 together with the metal element-containing gas and is exhausted from the exhaust pipe 231. The Ar gas acts as a carrier gas, and it is possible to obtain the effect of promoting the supply of the metal element-containing gas into the process chamber 201.

At this time, the valves 525 and 535 are opened, and the Ar gas flows into the gas supply pipes 521 and 531, in order to prevent the metal element-containing gas from entering the nozzle 420 and the nozzle 430. The Ar gas is supplied into the process chamber 201 through the gas supply pipes 320 and 330 and the nozzles 420 and 430 and is exhausted from the exhaust pipe 231.

At this time, the APC valve 243 is adjusted such that the internal pressure of the process chamber 201 is in a range of, for example, 1 to 3990 Pa. The supply flow rate of the metal element-containing gas controlled by the MFC 312 is in a range of, for example, 0.1 to 1.0 slm, preferably, in a range of 0.1 to 0.5 slm. Each of the supply flow rates of the Ar gas controlled by the MFCs 513, 523, and 533 is in a range of, for example, 0.1 to 20 slm. In addition, the notation of a numerical range of "1 to 3990 Pa" in the present disclosure means that a lower limit value and an upper limit value are included in the range. Therefore, for example, the range of "1 to 3990 Pa" means that pressure is "equal to or greater than 1 Pa and equal to or less than 3990 Pa". This holds for other numerical ranges.

At this time, only the metal element-containing gas and the Ar gas, which is the rare gas, flow into the process chamber 201. Here, a Mo-containing gas can be used as the metal element-containing gas. For example, molybdenum pentoxide ($MoCl_5$) gas, molybdenum dichloride dioxide ($MoO_2Cl_2$) gas, and molybdenum oxytetrachloride ($MoOCl_4$) gas can be used as the Mo-containing gas. A metal element-containing layer is formed on the wafer 200 by the supply of the metal element-containing gas. Here, in a case in which $MoO_2Cl_2$ gas is used as the metal element-containing gas, the metal element-containing layer is a Mo-containing layer. The Mo-containing layer may be a Mo layer containing Cl or O, may be an adsorption layer made of $MoO_2Cl_2$, or may include both of them. In addition, the Mo-containing layer is a film containing Mo as a main component and is a film that may contain elements, such as Cl, O, and H, in addition to the Mo element.

[Removal of Residual Gas (Step S15)]

After a lapse of a predetermined time from the start of the supply of the metal element-containing gas, for example, 0.01 to 10 seconds later, the valve 314 of the gas supply pipe 310 is closed to stop the supply of the metal element-containing gas. That is, the time for which the metal element-containing gas is supplied to the wafer 200 is in a range of, for example, 0.01 to 10 seconds. At this time, with the APC valve 243 of the exhaust pipe 231 open, the vacuum pump 246 vacuum-exhausts the process chamber 201 to remove the metal element-containing gas, which has not reacted or has contributed to forming the metal element-containing layer and remains in the process chamber 201, from the process chamber 201. That is, the inside of the process chamber 201 is purged (first purge step).

At this time, the valves 515, 525, and 535 are left open to maintain the supply of the Ar gas into the process chamber 201. The Ar gas acts as a purge gas, which makes it possible to enhance the effect of excluding, from the process chamber 201, the metal element-containing gas which has not reacted or has contributed to forming the metal element-containing layer and remains in the process chamber 201.

[Supply of Reducing Gas (Step S16)]

After the residual gas in the process chamber 201 is removed, the valve 324 is opened to allow the reducing gas to flow into the gas supply pipe 320. The flow rate of the reducing gas is adjusted by the MFC 322. Then, the reducing gas is supplied from the gas supply hole 420*a* of the nozzle 420 into the process chamber 201 and is exhausted from the exhaust pipe 231. At this time, the reducing gas is supplied to the wafers 200.

At this time, the valve 525 is opened at the same time to allow the Ar gas, which is the rare gas, to flow into the gas supply pipe 521. The flow rate of the Ar gas flowing through the gas supply pipe 521 is adjusted by the MFC 523. Then, the Ar gas is supplied into the process chamber 201 together with the reducing gas and is exhausted from the exhaust pipe 231 The Ar gas acts as a carrier gas, which makes it possible to obtain the effect of promoting the supply of the reducing gas into the process chamber 201.

At this time, the valves 515 and 535 are opened to allow the Ar gas to flow into the gas supply pipes 511 and 531, in order to prevent the metal element-containing gas from entering the nozzle 410 and the nozzle 430. The Ar gas is supplied into the process chamber 201 through the gas supply pipes 310 and 330 and the nozzles 410 and 430 and is exhausted from the exhaust pipe 231.

At this time, the APC valve 243 is adjusted such that the internal pressure of the process chamber 201 is in a range of, for example, 1 to 39900 Pa. The supply flow rate of the reducing gas controlled by the MFC 322 is in a range of, for example, 1 to 50 slm, preferably, in a range of 15 to 30 slm. Each of the supply flow rates of the Ar gas controlled by the MFCs 513, 523, and 533 is in a range of, for example, 0.1 to 30 slm. The time for which the reducing gas is supplied to the wafer 200 is in a range of, for example, 0.01 to 120 seconds.

At this time, only the reducing gas and the Ar gas, which is the rare gas, flow into the process chamber 201. Here, for example, hydrogen ($H_2$) gas, deuterium ($D_2$) gas, gas containing activated hydrogen, and the like can be used as the reducing gas. In a case in which the $H_2$ gas is used as the reducing gas, the substitution reaction of the $H_2$ gas with at least a portion of the Mo-containing layer formed on the wafer 200 in Step S14 occurs. That is, O or chlorine (Cl) in the Mo-containing layer reacts with $H_2$, is desorbed from the Mo layer, and is discharged from the process chamber 201 as a reaction by-product such as water vapor ($H_2O$), hydrogen chloride (HCl), or chlorine ($Cl_2$). Then, the metal element-containing layer (Mo layer) that contains Mo and does not substantially contain Cl and O is formed on the wafer 200.

[Removal of Residual Gas (Step S17)]

After the metal element-containing layer is formed, the valve 324 is closed to stop the supply of the reducing gas. Then, the reducing gas, which has not reacted or has contributed to forming the metal element-containing layer and remains in the process chamber 201, or the reaction by-product remaining in the process chamber 201 is excluded from the process chamber 201, using the Ar gas as the purge gas, by the same procedure as that in Step S15 (first purge step). That is, the inside of the process chamber 201 is purged (second purge step).

[Execution Predetermined Number of Times (Step S18)]

A cycle in which the processes in Steps S14 to S17 are sequentially executed is performed one or more times (a predetermined number of times (n times)) to form a metal element-containing film having a predetermined thickness (for example, 0.5 to 20.0 nm) on the wafer 200. It is preferable that the above-described cycle is repeated a plurality of times. Further, each of the processes in Steps S14 to S17 may be performed at least once.

[Supply of Modifying Gas (Step S19)]

After the residual gas in the process chamber 201 is removed, the valve 334 is opened to allow the modifying gas to flow into the gas supply pipe 330. The flow rate of the modifying gas is adjusted by the MFC 332. Then, the modifying gas is supplied from the gas supply hole 430*a* of the nozzle 430 into the process chamber 201 and is exhausted from the exhaust pipe 231. At this time, the modifying gas is supplied to the wafers 200.

At this time, the valve 535 is opened at the same time to allow the Ar gas, which is the rare gas, to flow into the gas supply pipe 531. The flow rate of the Ar gas flowing through the gas supply pipe 531 is adjusted by the MFC 533. Then, the Ar gas is supplied into the process chamber 201 together with the reducing gas and is exhausted from the exhaust pipe 231. The Ar gas acts as the carrier gas, which makes it possible to obtain the effect of promoting the supply of the modifying gas into the process chamber 201.

At this time, the valves 515 and 525 are opened to allow the Ar gas to flow into the gas supply pipes 511 and 521, in order to prevent the metal element-containing gas from entering the nozzle 410 and the nozzle 420. The Ar gas is supplied into the process chamber 201 through the gas supply pipes 310 and 320 and the nozzles 410 and 420 and is exhausted from the exhaust pipe 231.

At this time, the APC valve 243 is adjusted such that the internal pressure of the process chamber 201 is in a range of, for example, 1 to 3990 Pa. The supply flow rate of the modifying gas controlled by the MFC 332 is in a range of, for example, 0.1 to 30 slm, preferably, in a range of 0.1 to 10 slm. Each of the supply flow rates of the Ar gas controlled by the MFCs 513, 523, and 533 is in a range of, for example, 0.1 to 30 slm. The time for which the modifying gas is supplied to the wafer 200 is in a range of, for example, 1 to 1200 seconds.

At this time, only the modifying gas and the Ar gas, which is the rare gas, flow into the process chamber 201. For example, one type of gas among hydrogenated silicon gas, chlorosilane-based gas, oxygen-containing gas, nitrogen-containing gas, boron-containing gas, fluorine-containing gas, phosphorus-containing gas, and the like or a mixed gas containing at least one of them can be used as the modifying gas.

The supply of the modifying gas makes it possible to form a layer including an element contained in the modifying gas on the surface of the film on the wafer 200. In other words, it is possible to modify the surface of the film. In a case in which hydrogenated silicon gas is used as the modifying gas, a layer (cap layer) containing silicon (Si) can be formed on a surface of the Mo-containing film formed on the wafer 200 in Step S14. In addition, one type of gas among monosilane ($SiH_4$) gas, disilane ($Si_2H_6$) gas, and trisilane ($Si_3H_8$) gas or a mixed gas containing at least one of them can be used as the hydrogenated silicon gas.

In a case in which the Mo-containing film is not covered with the Si cap layer as illustrated in FIG. 6A, the influence of nitrogen (N) may occur. For example, the Mo-containing film is nitrided by nitrogen (N) in the air atmosphere, and the resistance of the Mo-containing film increases. In contrast, in this embodiment, the Si cap layer is formed on the Mo-containing film as illustrated in FIG. 6B. Therefore, it is possible to suppress the nitridation of the Mo-containing film caused by nitrogen in the air atmosphere and to reduce the influence of nitrogen.

[Removal of Residual Gas (Step S20)]

After the cap layer is formed, the valve 334 is closed to stop the supply of the modifying gas. Then, the modifying gas, which has not reacted or has contributed to forming the cap layer and remains in the process chamber 201, or the reaction by-product remaining in the process chamber 201 is excluded from the process chamber 201, using the Ar gas as the purge gas, by the same procedure as that in Step S15 (first purge step). That is, the inside of the process chamber 201 is purged (after-purge step).

[Return to Atmospheric Pressure (Step S21)]

After the atmosphere in the process chamber 201 is replaced with the Ar gas, the internal pressure of the process chamber 201 is returned to the normal pressure.

[Carrying-Out of Wafer]

Then, the seal cap 219 is lowered by the boat elevator 115, and the lower end of the outer tube 203 is opened. Then, the processed wafer 200 is carried out of the lower end of the outer tube 203 and into the transfer chamber 124 while being supported by the boat 217 (boat unloading (Step S22)). Then, the processed wafer 200 is transferred from the boat 217 to the pod 110 (wafer discharging (Step S23). In addition, it is preferable that the wafer 200 is carried out in a state in which setting of the temperature inside the process chamber 201 at the time of film formation is maintained. Since the wafer 200 is carried out in a state in which the setting of the temperature inside the process chamber 201 at the time of film formation is maintained, it is possible to shorten the time required to adjust the temperature of the process chamber 201.

In Step S12, the atmosphere in the transfer chamber 124 and the pod 110 are an Ar gas atmosphere. In Step S20, the atmosphere in the process chamber 201 is also the Ar gas atmosphere. Therefore, the processed wafer 200 is transferred from the process chamber 201 to the pod 110 through the transfer chamber 124 in the Ar gas atmosphere. This atmosphere makes it possible to suppress the nitridation of the Mo-containing film by nitrogen in the air atmosphere on the Mo-containing film in a state in which the internal temperature of the process chamber 201 at the time of substrate processing is maintained (that is, in a high temperature state).

In this embodiment, since the Si cap layer is formed on the Mo-containing film, it is possible to suppress the adsorption (nitridation) of nitrogen in the air atmosphere on the surface of the Mo-containing film and to reduce the influence of nitrogen. As described above, wafer discharging is performed in the Ar gas atmosphere such that the wafer 200 does not come into contact with nitrogen during the wafer discharging, which makes it possible to further suppress the nitridation of the Mo-containing film.

Effect of this Embodiment

As described above, the modifying process of forming a layer including the element contained in the modifying gas on the surface of the film containing the metal element, which has been formed on the wafer 200, is performed, which makes it possible to suppress the adsorption of oxygen or nitrogen on the surface of the film on the wafer 200. In addition, the adsorption of oxygen is also called oxidation. Further, the adsorption of nitrogen is also called nitridation.

Furthermore, it is possible to modify not only the film on the wafer 200 but also the film on the inner wall of the process chamber 201. Therefore, even when nitrogen gas enters the process chamber 201 at the time of the carrying-in of the wafer 200, it is possible to suppress the adsorption of nitrogen on the film on the inner wall of the process chamber 201. In a case in which nitrogen is adsorbed on the film on the inner wall of the process chamber 201, there is a possibility that the nitrogen will be desorbed at the time of film formation and incorporated into the film formed on the wafer 200. Therefore, the modification of the film on the inner wall of the process chamber 201 makes it possible to suppress the incorporation.

In the method of manufacturing a semiconductor device according to this embodiment, it is preferable that the wafer is carried out in a state in which the setting of the temperature inside the process chamber 201 in (c) and (d) is maintained.

When the wafer is carried out in a state in which the temperature setting at the time of film formation is maintained as described above, it is possible to shorten the time required to adjust the internal temperature of the process chamber 201. As a result, it is possible to improve manufacturing throughput. Further, it is possible to suppress the generation of thermal stress caused by a decrease in the temperature of a portion of the process chamber 201 and the transfer chamber 124 and thus to prevent the film from peeling due to the thermal stress.

In addition, it is preferable that the method includes: (f) creating an inert gas atmosphere excluding the rare gas in the process chamber 201 and in the transfer chamber 124 and transferring the wafer 200 from the transfer chamber 124 into the process chamber 201 before (a); and (g) replacing the inert gas atmosphere excluding the rare gas inside the process chamber 201 and inside the transfer chamber 124 with a rare gas atmosphere between (f) and (e).

As described above, an inexpensive inert gas is used before film formation, and an expensive rare gas is used only after film formation, which makes it possible to suppress the amount of expensive rare gas used.

Further, in (d), a silicon (Si)-containing layer may be formed on the surface of the film using hydrogenated silicon gas or chlorosilane-based gas as the modifying gas. One type of gas among monosilane ($SiH_4$) gas, disilane ($Si_2H_6$) gas, and trisilane ($Si_3H_8$) gas or a mixed gas containing at least one of them can be used as the hydrogenated silicon gas. Hexachlorodisilane (HCDS) can be used as the chlorosilane-based gas.

The nitridation of the film by nitrogen present outside the process chamber 201 can be suppressed by forming a silicon (Si)-containing layer on the surface of the film containing a metal element using these gases as the modifying gas.

Further, in (d), an oxide layer may be formed on the surface of the film using an oxygen (O)-containing gas as the modifying gas. One type of gas among oxygen ($O_2$) gas, water vapor ($H_2O$) gas, nitrogen monoxide (NO) gas, nitrous oxide ($N_2O$) gas, ozone ($O_3$) gas, a mixed gas of hydrogen ($H_2$) and oxygen ($O_2$) or a mixed gas containing at least one of them can be used as the oxygen-containing gas.

The adsorption (nitridation) of nitrogen, which is present outside the process chamber 201, on the surface of the film can be suppressed by oxidizing the surface of the film containing the metal element or by filling a site, which can bond to oxygen, in the surface of the film with oxygen, using these gases as the modifying gas.

Furthermore, in (d), a nitride layer may be formed on the surface of the film using a nitrogen-containing gas as the modifying gas. One type of gas among ammonia ($NH_3$) gas, hydrazine ($N_2H_4$) gas, diazene ($N_2H_2$) gas, and nitrogen ($N_2$) gas or a mixed gas containing at least one of them can be used as the nitrogen-containing gas.

A completely modified layer (nitride layer) may be formed on the surface of the film, instead of natural nitridation, by using these gases as the modifying gas. In addition, the completely modified layer means a state in which it is difficult for other elements to bond to the surface of the film. In the case of a Mo film, the complete modification means the formation of a MoN layer on the surface. The formation of this layer makes it possible to improve uniformity for each wafer 200 when the nitride layer is removed later. It is possible to uniformize the composition of the modified layer formed for each wafer 200. The uniformization of the composition of the modified layer for each wafer 200 makes it possible to suppress the occurrence of the removal rate of modification caused by a difference in composition. Further, the formation of this nitride layer makes it possible to suppress the adsorption of oxygen in the atmosphere on the surface of the film. That is, the adsorption of oxygen on the surface of the film can be suppressed by filling the site that can bond to oxygen in the surface of the film with nitrogen.

Furthermore, in (d), a boron (B)-containing layer may be formed on the surface of the film using a boron-containing gas as the modifying gas. In addition, one type of gas of diborane ($B_2H_6$) gas and boron trichloride ($BCl_3$) gas or a mixed gas containing at least one of them can be used as the boron-containing gas.

The adsorption of nitrogen or oxygen present outside the process chamber 201 can be suppressed by forming the boron-containing layer on the surface of the film containing the metal element using these gases as the modifying gas.

Moreover, in (d), a fluorine (F)-containing layer may be formed on the surface of the film using a fluorine-containing gas as the modifying gas. One type of gas among tungsten hexafluoride ($WF_6$) gas, fluorine ($F_2$) gas, nitrogen trifluoride ($NF_3$) gas, chlorine trifluoride ($ClF_3$) gas, and hydrogen fluoride (HF) gas or a mixed gas containing at least one of them can be used as the fluorine-containing gas.

The oxidation or nitridation of the film by oxygen or nitrogen present outside the process chamber 201 can be suppressed by fluorinating the surface of the film containing the metal element using these gases as the modifying gas.

In addition, in (d), a phosphorus (P)-containing layer may be formed on the surface of the film using a phosphorus (P)-containing gas as the modifying gas. Phosphine ($PH_3$) gas or a mixed gas containing the phosphine ($PH_3$) gas can be used as the phosphorus-containing gas.

The adsorption or reaction of nitrogen or oxygen present outside the process chamber 201 can be suppressed by forming the phosphorus (P)-containing layer on the surface of the film containing the metal element using these gases as the modifying gas.

Further, in (d), the setting of the temperature inside the process chamber 201 may be maintained or the setting of the temperature inside the process chamber 201 may be reduced as compared to (a) to (c). In a case in which the setting of the temperature inside the process chamber 201 is maintained, it is possible to improve manufacturing throughput. However, there is a possibility that the film will be oxidized or nitrided in the film modification step. Therefore, in the film modification step, it is preferable to form at least one of a Si-containing layer, an oxygen-containing layer, a nitrogen-containing layer, and a phosphorus-containing layer on the surface of the film.

Further, it is preferable that the rare gas is used as the carrier gas and the purge gas supplied in (a) to (d). This makes it possible to suppress the nitridation of the film during film formation and modification.

Other Embodiments

The embodiment of the present disclosure has been specifically described above. However, the present disclosure is not limited to the above-described embodiment, and various modifications can be made without departing from the gist of the present disclosure.

For example, in the above-described embodiment, an example has been described in which a film is formed using the substrate processing apparatus which is a batch-type vertical apparatus for processing a plurality of substrates at one time. However, the present disclosure is not limited thereto. The present disclosure can also be suitably applied to a case in which a film is formed using a single-wafer-type substrate processing apparatus that processes one or several substrates at one time.

Furthermore, the substrate processing apparatus according to the embodiment of the present disclosure can be applied not only to a semiconductor manufacturing apparatus that manufactures a semiconductor but also to an apparatus, such as an LCD apparatus, that processes a glass substrate. Furthermore, for examples, the process for the substrate includes, CVD, PVD, a process of forming an oxide film and a nitride film, a process of forming a film containing metal, an annealing process, oxidizing, nitriding, and a diffusion process. Furthermore, it goes without saying that the present disclosure can also be applied to various substrate processing apparatuses such as an exposure apparatus, a coating apparatus, a drying apparatus, and a heating apparatus.

According to the present disclosure, it is possible to suppress an increase in the resistance of a film containing a metal element.

What is claimed is:

1. A method of processing a substrate, comprising:

(a) supplying a metal element-containing gas to a substrate accommodated in a process vessel;

(b) supplying a reducing gas to the substrate;

(c) performing (a) and (b) a predetermined number of times to form a film containing a metal element on the substrate;

(d) supplying a modifying gas to the film to form a layer including an element contained in the modifying gas on a surface of the film after (c);

(e) creating a rare gas atmosphere in the process vessel and in a transfer chamber adjacent to the process vessel and carrying the substrate out of the process vessel and into the transfer chamber after (d);

(f) creating an inert gas atmosphere excluding a rare gas in the process vessel and in the transfer chamber and carrying the substrate from the transfer chamber into the process vessel before (a); and (g) replacing the inert gas atmosphere excluding the rare gas inside the transfer chamber with the rare gas atmosphere between (f) and (e).

2. The method according to claim 1, wherein (e) is performed in a state in which setting of a temperature inside the process vessel in (c) and (d) is maintained.

3. The method according to claim 1, wherein, in (d), a silicon-containing layer is formed on the surface of the film using hydrogenated silicon gas or chlorosilane-based gas as the modifying gas.

4. The method according to claim 1, wherein, in (d), an oxide layer is formed on the surface of the film using an oxygen-containing gas as the modifying gas.

5. The method according to claim 1, wherein, in (d), a nitride layer is formed on the surface of the film using a nitrogen-containing gas as the modifying gas.

6. The method according to claim 1, wherein, in (d), a boron-containing layer is formed on the surface of the film using a boron-containing gas as the modifying gas.

7. The method according to claim 1, wherein, in (d), a fluorine-containing layer is formed on the surface of the film using a fluorine-containing gas as the modifying gas.

8. The method according to claim 1, wherein, in (d), a phosphorus-containing layer is formed on the surface of the film using a phosphorus-containing gas as the modifying gas.

9. The method according to claim 1, wherein, in (d), setting of a temperature inside the process vessel is maintained or reduced as compared to (a) to (c).

10. The method according to claim 1, wherein a rare gas is used as a carrier gas and a purge gas supplied in (a) to (d).

11. A non-transitory computer-readable recording medium storing a program that causes, by a computer, a substrate processing apparatus to perform a process comprising:

(a) supplying a metal element-containing gas to a substrate accommodated in a process vessel;

(b) supplying a reducing gas to the substrate;

(c) performing (a) and (b) a predetermined number of times to form a film containing a metal element on the substrate;

(d) supplying a modifying gas to the film to form a layer including an element contained in the modifying gas on a surface of the film after (c);

(e) creating a rare gas atmosphere in the process vessel and in a transfer chamber adjacent to the process vessel and carrying the substrate out of the process vessel and into the transfer chamber after (d);

(f) creating an inert gas atmosphere excluding a rare gas in the process vessel and in the transfer chamber and carrying the substrate from the transfer chamber into the process vessel before (a); and (g) replacing the inert gas atmosphere excluding the rare gas inside the transfer chamber with the rare gas atmosphere between (f) and (e).

12. A substrate processing apparatus comprising:

a process vessel;

a transfer chamber adjacent to the process vessel;

a transfer system configured to transfer a substrate;

a metal element-containing gas supply system configured to supply a metal element-containing gas into the process vessel;

a reducing gas supply system configured to supply a reducing gas into the process vessel;

a modifying gas supply system configured to supply a modifying gas into the process vessel;

a rare gas supply system configured to supply a rare gas into the process vessel and the transfer chamber;

an inert gas supply system configured to supply an inert gas excluding the rare gas into the transfer chamber;

an exhaust system configured to exhaust the process vessel and the transfer chamber; and a controller configured to be capable of controlling the transfer system, the metal element-containing gas supply system, the reducing gas supply system, the modifying gas supply system, the rare gas supply system, the inert gas supply system, and the exhaust system such that the method of claim 1 is executed.

13. A method of manufacturing a semiconductor device comprising the method of claim 1.

* * * * *